United States Patent [19]
Flachslaender

[11] Patent Number: 5,850,334
[45] Date of Patent: Dec. 15, 1998

[54] CASING FOR A TRANSPORTABLE MEDICAL CONSTRUCTION UNIT

[75] Inventor: Erwin Flachslaender, Calw-Stammheim, Germany

[73] Assignee: Hewlett-Packard Company, Palo Alto, Calif.

[21] Appl. No.: 701,471

[22] Filed: Aug. 21, 1996

[30] Foreign Application Priority Data

Oct. 19, 1995 [EP] European Pat. Off. .............. 95116471

[51] Int. Cl.⁶ ..................................................... H05K 5/02
[52] U.S. Cl. ......................... 361/747; 361/728; 174/52.1; 174/52.3
[58] Field of Search .................................... 361/728, 746, 361/747, 724, 725, 726, 818, 752; 174/35 R, 52.1, 52.3; 128/696, 710; D24/185, 186; 607/1–76

[56] References Cited

U.S. PATENT DOCUMENTS

| | | | |
|---|---|---|---|
| 3,311,792 | 3/1967 | Scoville | 174/52.1 |
| 4,158,757 | 6/1979 | Reichert et al. | 174/52.3 |
| 4,567,336 | 1/1986 | Lemche | 200/305 |
| 5,533,625 | 7/1996 | Mikkelsen | 206/565 |

FOREIGN PATENT DOCUMENTS

| | | | |
|---|---|---|---|
| 0671183A1 | 3/1995 | European Pat. Off. | A61N 1/39 |
| 343.074 | 7/1904 | France . | |
| 3319334C1 | 5/1983 | Germany | H05K 9/00 |
| 3323604A1 | 6/1983 | Germany | H05K 5/03 |

OTHER PUBLICATIONS

European Search Report, EP 95 11 6471, dtd 2 Apr. 1996.

*Primary Examiner*—Leo P. Picard
*Assistant Examiner*—John B. Vigushin

[57] ABSTRACT

Transportable, medical construction unit with a casing for receiving essentially electronic components with at least two casing parts surrounding the components. For the connection of adjacent casing parts rings are shaped onto the inner wall of the casing parts and coincide with the rings of the adjacent casing part. Locking pins are passed through coinciding rings arranged in aligned manner on a casing wall formed from the two partial casing walls. This ensures a reliable, mechanical connection of the casing parts with a minimum space requirement for the connecting elements.

5 Claims, 4 Drawing Sheets

CASING FOR A TRANSPORTABLE MEDICAL CONSTRUCTION UNIT

FIELD OF THE INVENTION

The present invention relates to a transportable, medical construction unit containing a casing for receiving essentially electronic components.

BACKGROUND OF THE INVENTION

In connection with the miniaturization of medical equipment, which are mainly installed bedside, i.e. adjacent to the patient and which are able to measure, evaluate and transmit to a monitor the most important medical parameters, such as e.g. ECG, breathing or blood pressure, for hygienic reasons they must have an allround, tightly sealed casing, so that during cleaning no moisture can pass into the interior. However, not much space is available for the connection of the individual casing parts, because the construction unit must be as small and handy as possible. Screw connections are in particular disadvantageous, because they must be displaced towards the inside on the casing edge and are therefore relatively space-consuming. Screw connections are particularly disadvantageous if, for patient safety reasons, an insulating plane must be incorporated in the interior of the casing, because the screws penetrate said insulating plane. When using detents for closing the casing once again openings are necessary, in order to permit the opening of the casing.

The problem of the present invention is therefore to propose a solution, which allows a reliable mechanical connection of the casing parts with a limited space requirement for the connecting elements and a tight casing.

SUMMARY OF THE INVENTION

According to the invention this problem is solved by a transportable, medical construction unit having the features of the main claim. Further advantageous developments can be gathered from the subclaims.

The construction unit has a casing for receiving essentially electronic components with at least two casing parts surrounding the components and for the connection of adjacent casing parts rings or loops are shaped onto the inner wall of the casing parts and coincide with the rings or loops of the adjacent casing part. For the connection of the adjacent casing parts locking pins are placed through the coinciding rings arranged in aligned manner on a casing wall formed from the two partial casing walls. Therefor the reliable closure of the casing can take place by means of two straight locking pins along e.g. two facing casing walls. The locking pins are passed from the outside through a casing wall at an angle to the locking casing wall. The locking pins have as a stop a head on which engagement can take place for the removal of the locking pin. The sealing of the locking pins can be brought about either by sealants introducible between the head and the casing wall, or by an additional cover.

According to a preferred embodiment the front end has an additional cover, which covers and secures the locking pins. The cover is held on the casing parts by means of a snap closure. As a result of this special design the construction unit is closed all round and protected against penetrating moisture. The locking pins are invisible and consequently do not offer themselves as a dismantling possibility with respect to the casing for unauthorized persons. At a glance it is not apparent how the casing is to be opened.

Advantageously the casing parts, locking pins and cover are made from plastic. For the case no insulation is required, metal pins can also be used.

According to another preferred embodiment the construction unit has between an upper cover part as the first casing part and a lower casing part as the base part a central casing part in the form of an insulating part, which separates the space enclosed by the upper cover part from the space enclosed by the base part. The central casing part is correspondingly connected by means of locking pins on the one hand to the upper cover part and on the other to the base part. Fundamentally this construction form and connection by means of rings and locking pins can be extended to random further casing parts.

Thus, the invention provides a transportable, medical construction unit, where a reliable, mechanical connection of the casing parts is ensured, with a minimum space requirement for the connecting elements. The connecting elements are located internally and are consequently invisible and inaccessible from the outside. The casing parts have no openings, so that the necessary electrical insulation is maintained. In additional, simple assembly and disassembly without tools is possible. A loosening of the connection under vibration action is not possible. The invention is also of economic interest due to the use of plastic injection mouldings.

BRIEF DESCRIPTION OF THE DRAWINGS

The invention is described in greater detail hereinafter relative to a particularly preferred embodiment and the attached drawings, wherein show.

DETAILED DESCRIPTION OF THE INVENTION

Figure 1:
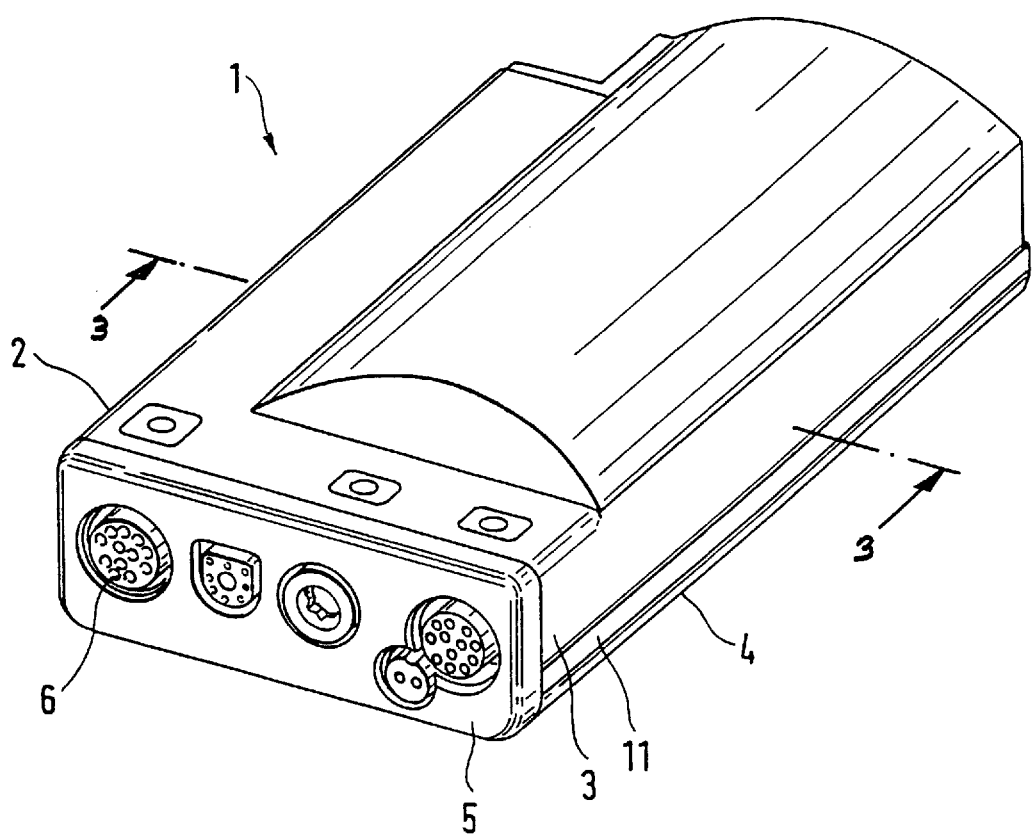
FIG. 1 a perspective overall view of a medical, transportable construction unit.

FIG. 1 shows an embodiment of a portable, medical construction unit 1 having a casing 2, which is constituted by an upper casing part 3, a lower casing part 4, a central casing part 11 located between the two casing parts 3, 4 and a cover 5 located at the front end and provided with recesses for electrical plug connection 6. The resulting construction unit is approximately 188 mm long, 96.5 mm wide and 50.5 mm high.

Figure 2:
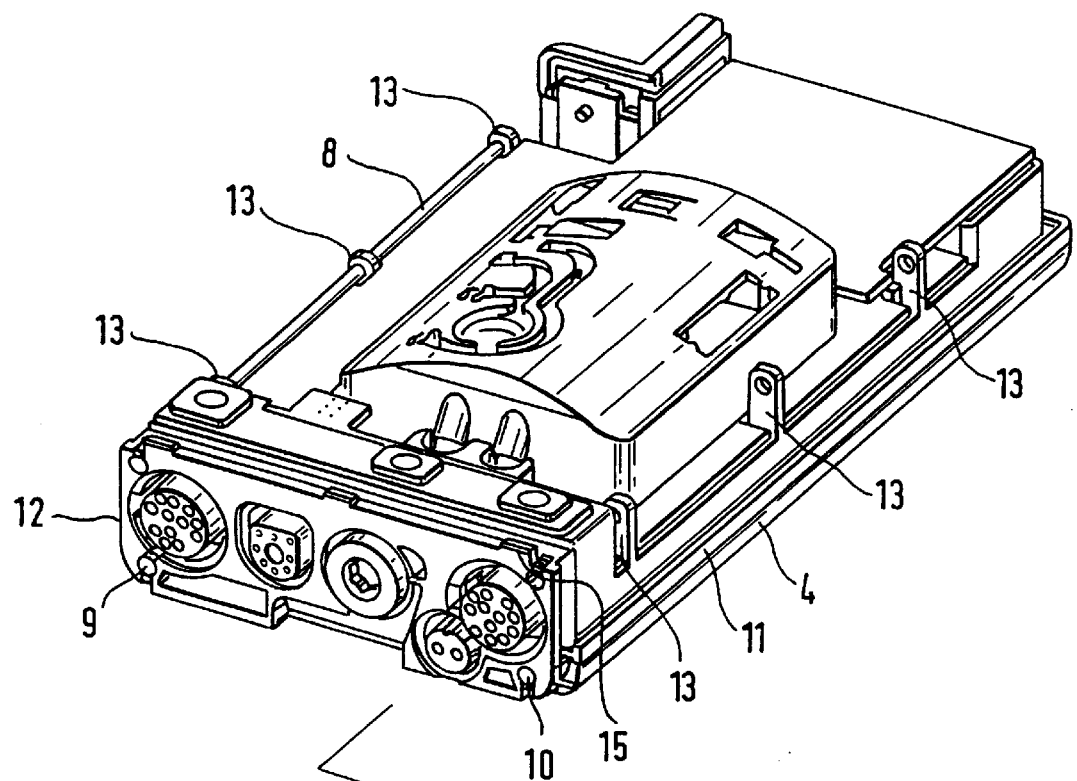
FIG. 2 the construction unit of FIG. 1 with the upper casing part removed.
Figure 2:
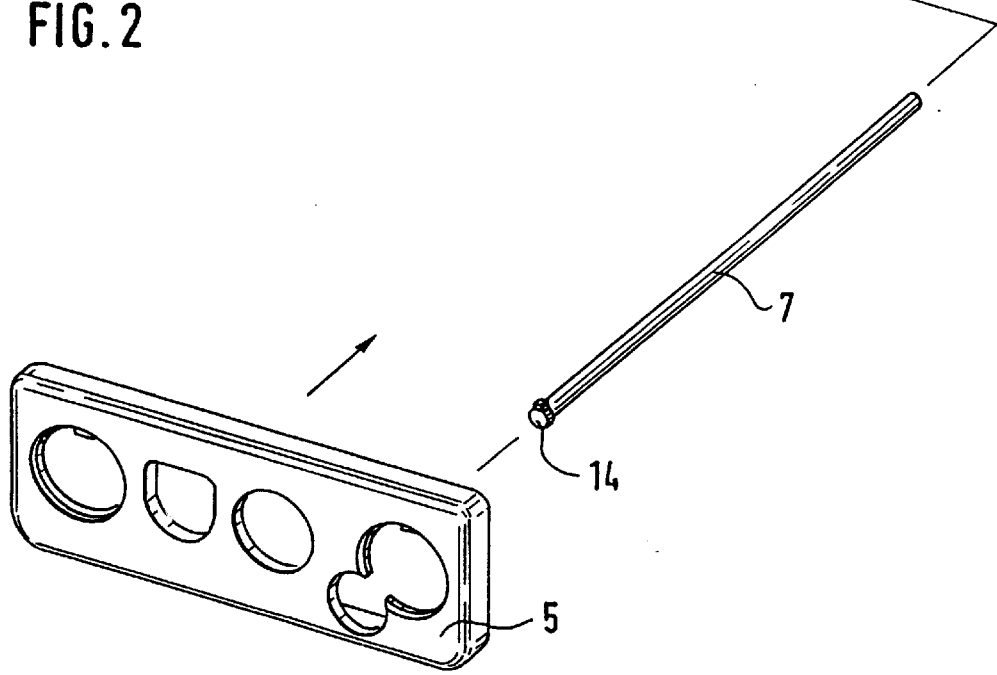

FIG. 2 shows the construction unit 1 without the upper casing part 3 and the cover 5 together with a locking pin 7 removed from the lower casing part 4. In this embodiment the construction unit 1 has locking pins 7 to 10 extending in the longitudinal direction of the casing and which are inserted into said casing 2 from the front end 12. The rings 13 passed through the locking pins 7 and 8 are fixed to the central casing part 11. The locking pins 9 and 10 pass through rings, which are not visible in this drawing, in the interior of the casing 2. All the locking pins have a head 14, which serves as a stop during insertion and also for better removal purposes. The cover 5 is held in position by means of detents 15 and prevents a detachment of the locking pins 7 to 10, e.g. due to vibrations.

Figure 3:
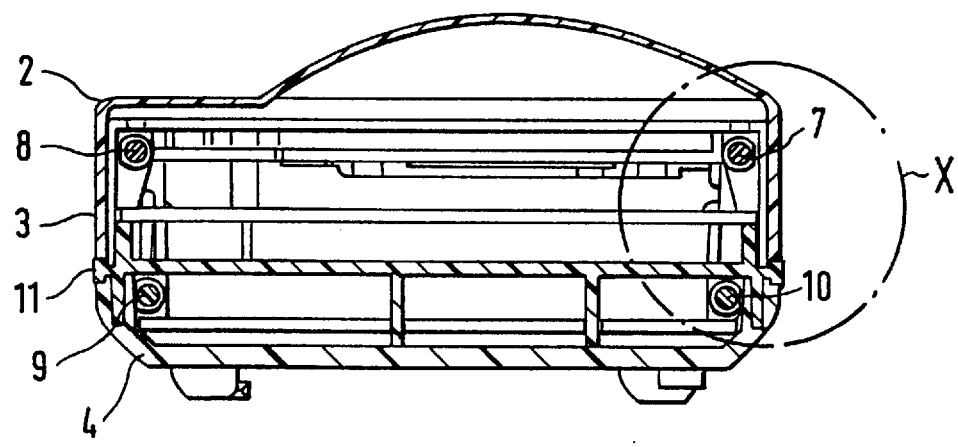
FIG. 3 a cross-sectional view along section 3—3 of FIG. 1.

FIG. 3 shows the casing parts 3, 4 and 11, as well as the locking pins 7 to 10 in cross-section.

Figure 4A:
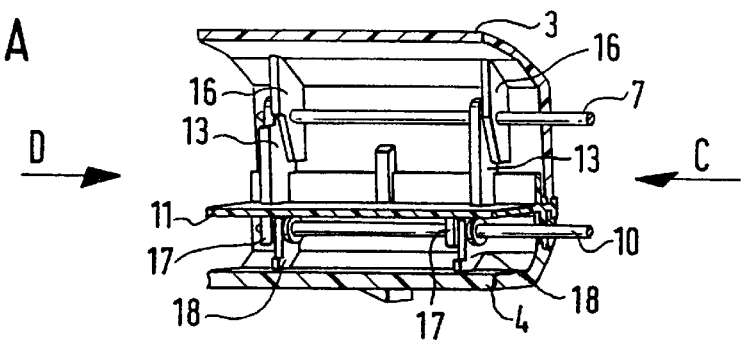
FIG. 4A a right side perspective view of detail X in FIG. 3.

For better illustration purposes detail X of FIG. 3 is shown again in perspective view and on a larger scale in FIG. 4A. FIG. 4A shows the upper casing part 3, the lower casing part 4 and the central casing part 11 with the associated shaped rings 16 (casing part 3), rings 13, 17 (casing part 11) and rings 18 (casing part 4). Through the corresponding openings of the rings 13, 16 is passed the locking pin 7 and through the openings of rings 17, 18 the locking pin 10.

Figure 4B:
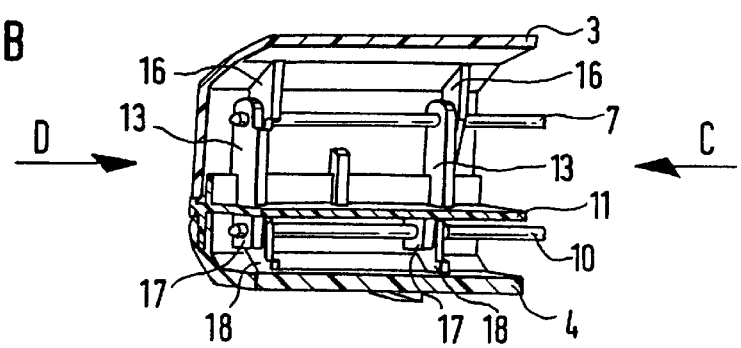
FIG. 4B a left side perspective view of detail X of FIG. 1.
Figure 4C:
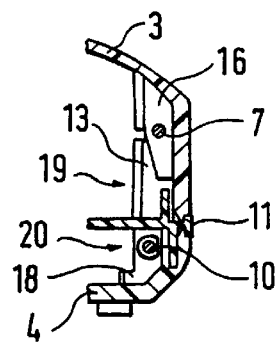
FIG. 4C a side sectional view from side C of FIG. 4B.
Figure 4D:
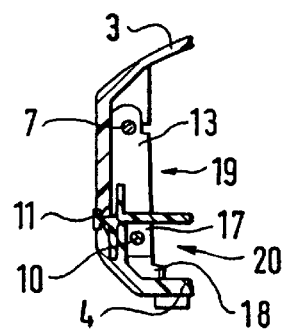
FIG. 4D a side sectional view from side D of FIG. 4B.

FIG. 4A is a plan view of a partial section of detail X of FIG. 3 and FIG. 4B is a plan view of the opposite side. FIG. 4C shows the mounting of the pin 7 in the ring 16 fixed to the upper casing part 3 and the mounting of the pin 10 in the ring 18 fixed to the lower casing part 4. FIG. 4D shows the corresponding mounting of the locking pins 7, 10 in the rings 13, 17. A comparison of the drawing shows that the locking pins reliably brace the casing parts.

FIGS. 4C and 4D also show the mounting of the individual casing parts 3, 4 and 11 for sealing the casing. The central casing part 11 is used for the electrical separation or isolation of the upper casing space 19 and the lower casing space 20.

I claim:

1. A casing comprising:
    a first casing part with a plurality of first apertures positioned generally along opposed sides of said first casing part;
    a second casing part with a plurality of second apertures positioned generally along opposed sides of said second casing part, said first casing part and second casing part, when mated together causing first apertures along one side of said first casing part to be in substantial alignment with second apertures along one side of said second casing part and first apertures along an opposed side of said first casing part to be in substantial alignment with second apertures along an opposed side of said second casing part;
    a first locking pin positioned in and coupling said first apertures and second apertures along said one side of said first casing part and second casing part, respectively; and
    a second locking pin positioned in and coupling said first apertures and second apertures along said opposed side of said first casing part and second casing part, respectively, said first locking pin and second locking pin thereby acting to affix said first casing part to said second casing part.

2. The casing as recited in claim 1, further comprising:
    a cover positioned on a front end of said first casing part and said second casing part and securing in place said first locking pin and second locking pin.

3. The casing as recited in claim 2, wherein said casing parts, locking pins and cover are made of a plastic material.

4. The casing as recited in claim 1, further comprising:
    an intermediate casing part positioned between said first casing part and said second casing part for creating separated volumes within said casing, a first one of said volumes defined by a first surface of said intermediate casing part and said first casing part, and a second one of said volumes created by an opposed surface of said intermediate casing part and said second casing part.

5. A casing comprising:
    an upper casing part with a plurality of first apertures positioned generally along opposed sides of said upper casing part;
    a lower casing part with a plurality of second apertures positioned generally along opposed sides of said lower casing part;
    an intermediate casing part positioned between said upper casing part and said lower casing part, said intermediate casing part having a plurality of third apertures positioned generally along opposed sides of an upper surface thereof and a plurality of fourth apertures positioned generally along opposed sides of a lower surface thereof, said upper casing part and lower casing part, when mated together to sandwich said intermediate casing part causing (i) first apertures along one side of said upper casing part to be in substantial alignment with third apertures along one side of said upper surface of said intermediate casing part, and first apertures along an opposed side of said upper casing part to be in substantial alignment with third apertures along an opposed side of said upper surface of said intermediate casing part and (ii) second apertures along one side of said lower casing part to be in substantial alignment with fourth apertures along one side of said lower surface of said intermediate casing part, and second apertures along an opposed side of said lower casing part to be in substantial alignment with fourth apertures along an opposed side of said lower surface of said intermediate casing part;
    a first locking pin positioned in and coupling said first apertures and third apertures along said one side of said upper casing part and intermediate casing part, respectively;
    a second locking pin positioned in and coupling said first apertures and third apertures along said opposed side of said upper casing part and intermediate casing part, respectively;
    a third locking pin positioned in and coupling said second apertures and fourth apertures along said one side of said lower casing part and intermediate casing part, respectively; and
    a fourth locking pin positioned in and coupling said second apertures and fourth apertures along said opposed side of said lower casing part and intermediate casing part, respectively, said first locking pin, second locking pin, third locking pin and fourth locking pin thereby acting to affix said upper casing part to said lower casing part via said intermediate casing part.

* * * * *